United States Patent
Cooke et al.

(10) Patent No.: US 8,006,358 B2
(45) Date of Patent: Aug. 30, 2011

(54) METHOD FOR MANUFACTURING A PIEZOELECTRIC ACTUATOR

(75) Inventors: Michael Peter Cooke, Gillingham (GB); Christopher Andrew Goat, Offham (GB)

(73) Assignee: Delphi Technologies Holding S.arl, Troy, MI (US)

( * ) Notice: Subject to any disclaimer, the term of this patent is extended or adjusted under 35 U.S.C. 154(b) by 780 days.

(21) Appl. No.: 12/011,920

(22) Filed: Jan. 30, 2008

(65) Prior Publication Data
US 2009/0038130 A1 Feb. 12, 2009

(30) Foreign Application Priority Data
Jan. 30, 2007 (EP) .................................... 07250387

(51) Int. Cl.
*H04R 17/00* (2006.01)
(52) U.S. Cl. ............. 29/25.35; 29/830; 29/831; 29/846; 310/334
(58) Field of Classification Search ................. 29/25.35, 29/830, 831, 846; 310/334
See application file for complete search history.

(56) References Cited

U.S. PATENT DOCUMENTS

| | | | | |
|---|---|---|---|---|
| 4,514,247 A * | 4/1985 | Zola | | 156/250 |
| 5,196,756 A * | 3/1993 | Kohno et al. | | 310/328 |
| 5,384,030 A * | 1/1995 | Duce et al. | | 204/426 |
| 5,844,349 A * | 12/1998 | Oakley et al. | | 310/358 |
| 6,088,894 A * | 7/2000 | Oakley et al. | | 29/25.35 |
| 6,822,374 B1 * | 11/2004 | Smith et al. | | 310/334 |
| 7,208,862 B2 * | 4/2007 | Florian et al. | | 310/366 |
| 7,540,079 B2 * | 6/2009 | Okuyama et al. | | 29/830 |
| 7,698,812 B2 * | 4/2010 | Hamilton et al. | | 29/830 |
| 2002/0149296 A1 * | 10/2002 | Fujii et al. | | 310/328 |
| 2003/0051323 A1 * | 3/2003 | Gururaja | | 29/25.35 |
| 2006/0043842 A1 * | 3/2006 | Iwase et al. | | 310/344 |
| 2007/0069610 A1 * | 3/2007 | Ono et al. | | 310/328 |

FOREIGN PATENT DOCUMENTS

| | | |
|---|---|---|
| JP | 63084175 | 4/1988 |
| JP | 09153649 | 6/1997 |
| WO | 2006/074790 | 7/2006 |

* cited by examiner

*Primary Examiner* — Derris H Banks
*Assistant Examiner* — Azm Parvez
(74) *Attorney, Agent, or Firm* — Thomas N. Twomey

(57) ABSTRACT

A method for manufacturing a piezoelectric actuator, the method comprising: co-extruding alternating strips of a high permittivity material and a low permittivity material to form a green tape comprising said alternating strips of said high permittivity material and said low permittivity material; cutting said green tape to form a plurality of sheets, each sheet comprising a high permittivity region and at least two low permittivity regions adjacent to the high permittivity region; applying at least one conductive region to each one of two or more of the sheets to overly the high permittivity region and to leave exposed at least one low permittivity region; and stacking a plurality of sheets to form an actuator stack comprising adjacent sheets, wherein the or each conductive region on each sheet is offset with respect to a conductive region on a different sheet within the actuator stack.

16 Claims, 10 Drawing Sheets

SECTION ON R-S

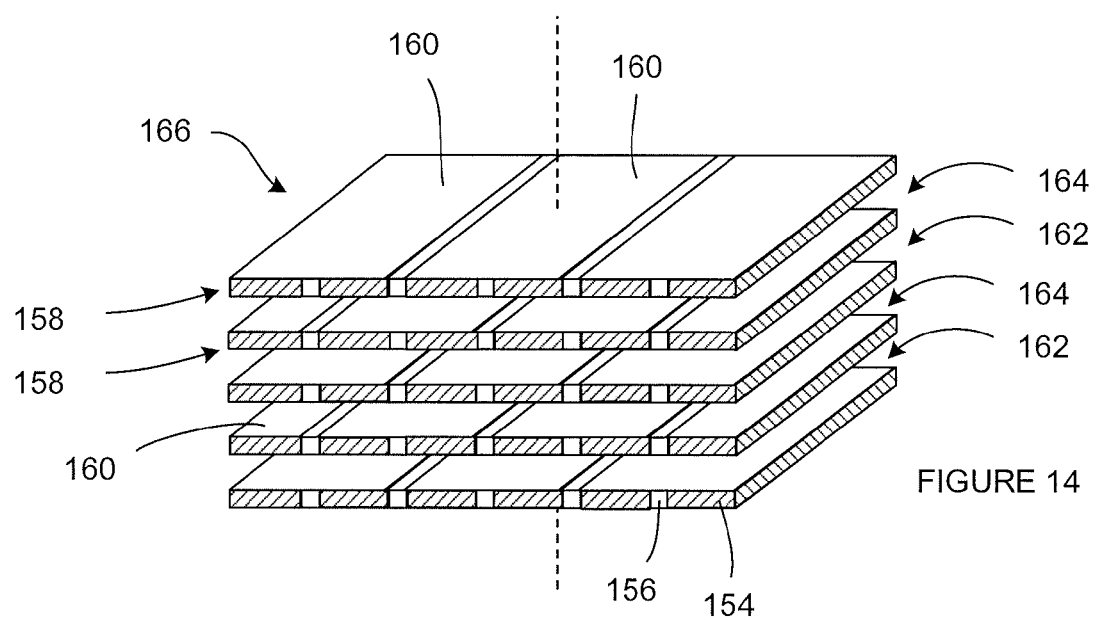
FIGURE 14
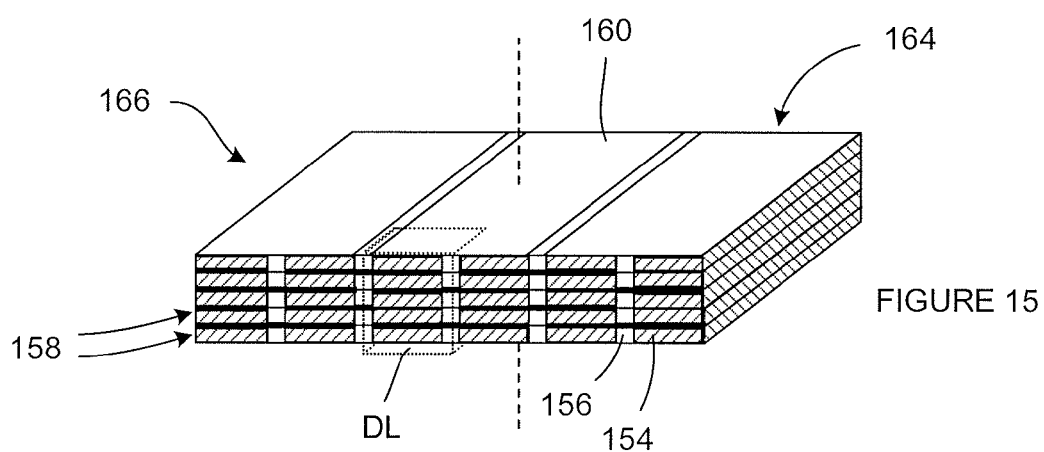
FIGURE 15
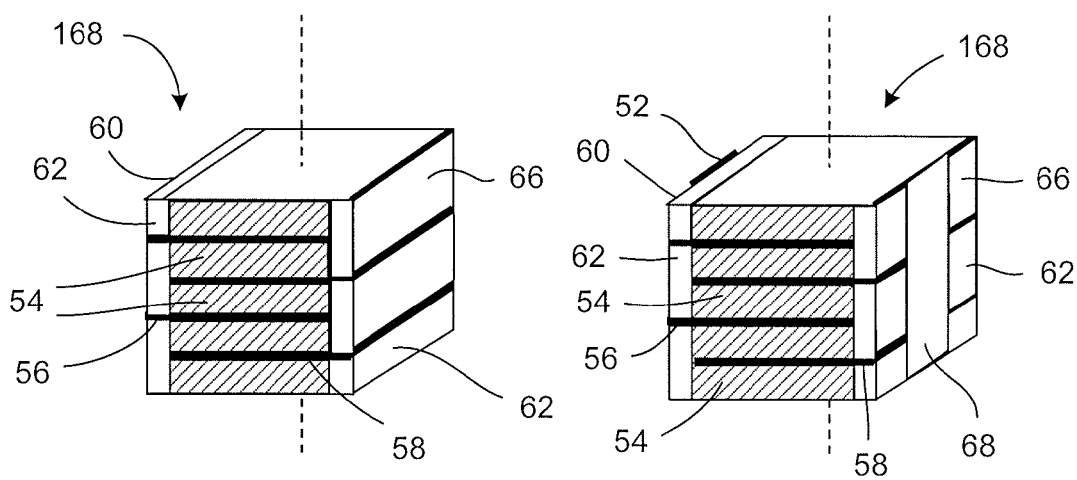
FIGURE 16
FIGURE 17

METHOD FOR MANUFACTURING A PIEZOELECTRIC ACTUATOR

This invention relates to a method for manufacturing a piezoelectric actuator, suitable for use in a fuel injector in an internal combustion engine.

Referring to FIG. 1 of the accompanying drawings, a known piezoelectric actuator 30 has a stack structure formed from an alternating sequence of piezoelectric layers 32 and planar internal electrodes 34. The piezoelectric layers 32, in turn, form an alternating sequence of oppositely polarised layers, and the internal electrodes 34 form an alternating sequence of positive and negative internal electrodes. The positive internal electrodes, one of which is indicated at are in electrical connection with a first side electrode, referred to as the positive side electrode 38. Likewise, the negative internal electrodes, one of which is indicated at 40, are in electrical connection with a second side electrode, referred to as the negative side electrode 42. Typically, each internal electrode 36, 40 is approximately 2 μm thick, and each piezoelectric layer 32 is around 100 μm thick. The stack may comprise of the order of 1000 such piezoelectric layers.

FIG. 2 of the accompanying drawings shows a cross section of the actuator 30 of FIG. 1 coplanar with a positive internal electrode 36. An edge of the positive internal electrode 36 connects with the positive side electrode 38. However, the positive internal electrode 36 extends only partially across the stack, to define an insulating region 44 between the edge of the positive internal electrode 36 and the negative side electrode 42 so that the positive internal electrode 36 is electrically isolated from the negative side electrode 42. In a similar manner, each of the other positive internal electrodes 36 defines an insulating region between its edge and the negative side electrode 42. Likewise, each of the negative internal electrodes 40 (not shown in FIG. 2) defines an insulating region between its edge and the positive side electrode 38.

A typical process suitable for manufacturing the actuator of FIGS. 1 and 2 will now be described.

The piezoelectric layers are formed by a tape-casting process. A typical tape casting apparatus 100 is shown schematically in FIG. 3. A substrate 102 carried on a feed roll 104 is fed horizontally under a hopper or reservoir 106 containing a slurry or suspension of ceramic particles dispersed in a solvent and mixed with a binder. The substrate 102 is usually a thin sheet of flexible polymer, such as polyester or cellulose acetate. Typically, most of the ceramic particles in the slurry are made from a piezoelectric ceramic such as lead zirconate titanate (PZT), the solvent is preferably water, and the binder is a polymer such as poly(vinyl alcohol) or poly(vinyl acetate). The slurry may contain other constituents, such as sintering aids, plasticizers and pigments.

As the substrate 102 passes under the reservoir 106, slurry is deposited on the substrate 102 by virtue of the horizontal movement of the substrate 102 across an outlet (not shown) of the reservoir 106. The viscosity of the slurry, the speed of movement of the substrate 102, the size of the outlet of the reservoir 106 and the gap between the substrate 102 and the outlet of the reservoir 106 are adjusted so as to give a uniform, controlled deposition of slurry onto the substrate 102.

After deposition of the slurry, the substrate 102 and the deposited slurry pass under a blade (not shown in FIG. 3), known as a doctor blade, which is positioned at a pre-defined distance above the substrate 102. As the deposited slurry is drawn underneath the doctor blade, the blade levels the slurry to form a layer 108 of pre-defined, uniform thickness.

The substrate 102 and the slurry layer 108 then pass into a drying assembly 110, which gently heats the slurry so as to evaporate the solvent. The drying assembly 110 may, for example, use infra-red heating or warm air drying to drive off the solvent. The substrate 102 may also pass over a heated plate within the drying assembly 110 so as to encourage drying of the slurry through the whole thickness of the layer 108. The dried material forms a flexible film or layer, known as a green tape 112, on the substrate 102. The green tape 112 comprises a closely-packed assembly of ceramic particles, each of which carries a surface coating of binder. The binder causes the particles to bind to one another in the assembly, and imparts flexibility and fracture resistance to the green tape 112. The space between the particles in the green tape 112 is occupied by air and excess binder.

After leaving the drying assembly 110, the substrate 102 and the green tape 112 are wound on to a receiving roll 114. Further drying may take place after winding.

The receiving roll 114 of green tape 112 is then sliced into smaller sheets, and the green tape 112 is removed from the substrate 102. The sheets of green tape are then transferred to a screen-printing apparatus (not shown), in which an electrically conductive ink is printed on to the surface of the green tape in a desired pattern so as to form the internal electrodes 34 of the actuator. The conductive ink typically contains metallic particles, such as platinum, copper or silver-palladium, dispersed in a suitable solvent which evaporates after printing.

The printed sheets are then stacked on top of one another in a pre-defined stacking sequence, so that the printed regions are suitably positioned to form the appropriate arrangement of positive and negative internal electrodes 36, 40 within the stack of sheets, as can be seen in FIGS. 1 and 2. The sheets are then pressed together. Heat is applied to the stacks of sheets during pressing so that the polymeric binder softens, which causes the sheets to bind to one another.

Each stack of sheets is then heated to a firing temperature, which lies close to, but not above, the melting temperature of the ceramic particles of the green tape and the metallic particles of the conductive ink, and which is typically around 1000° C. At relatively low temperatures, the binder burns away. To prevent cracking due to escaping gases, the temperature may be increased slowly or held at a constant temperature while the binder burns away. At higher temperatures, the ceramic particles sinter together, causing a reduction in the number and size of the pores between the ceramic particles so that the stack becomes strong and dense. The sintered ceramic of the green tape 112 thus forms the piezoelectric layers 32 of the actuator 30. The metallic particles in the conductive ink also sinter together, so as to form internal electrodes 34 comprising contiguous conductive paths in the stack where the ink was printed.

After firing, the stack of sheets is diced into individual actuator stacks. Positive and negative side electrodes (38, 42 in FIG. 1) are then applied to each actuator stack, for example by printing. The actuator 30 may then be encased or covered with a protective can or polymer sheath.

Many variations of the process described above are known in the art. For example, the stacked sheets may be diced into individual actuator stacks before firing, and the stacked sheets may be held under compressive pressure during firing.

Returning to FIGS. 1 and 2, the operation of the piezoelectric actuator will now be described. When a voltage is applied between the two side electrodes 38, 42, the resulting electric fields between each pair of adjacent positive and negative internal electrodes 36, 40 cause each piezoelectric layer 32 to undergo a change in thickness and, therefore, the piezoelectric stack undergoes a strain along its length, i.e. along an axis normal to the plane of each internal electrode 36, 40. Because of the polarisation of the piezoelectric layers 32, it follows that the magnitude of the strain can be controlled by adjusting the applied voltage. In addition, the direction of the strain can be reversed by switching the polarity of the applied voltage. Rapidly varying the magnitude and/or polarity of the applied voltage causes rapid changes in the strength and/or direction of the electric fields across the piezoelectric layers 32, and consequentially rapid variations in the length of the piezoelectric actuator 30. Typically, the piezoelectric layers 32 of the stack are formed from a ferroelectric material with high permittivity, such as lead zirconate titanate.

Such an actuator is suitable for use in a fuel injector, for example of the type known from the present Applicant's European Patent No. EP 0995901 B. The fuel injector is arranged so that a change in the length of the actuator results in a movement of a valve needle. The needle can be thus raised from or lowered onto a valve seat by control of the actuator length so as to permit a quantity of fuel to pass through drillings provided in the valve seat and into the associated engine.

To achieve good control of the valve needle, it is desirable that the available change in length of the actuator is as large as possible. For a given piezoelectric material and actuator construction, the change in actuator length that occurs when a voltage is applied between the two electrodes depends on the number of piezoelectric layers provided, i.e. the length of the stack, and the magnitude of the applied voltage. Increasing either of these parameters results in a larger length change. It is often impractical to increase the length of the stack, since the space within a fuel injector in which the actuator can be accommodated is restricted. Therefore, it is desirable that high voltages can be repeatedly applied to an actuator. However, driving an actuator with a high voltage reduces its reliability, as will now be discussed.

When a voltage is applied between the positive and negative internal electrodes 36, 40, by way of the side electrodes 38, 42, an electric field is set up between the internal electrodes 36, 40, and within the piezoelectric layers 32. The strength and direction of the electric field in part of the actuator of FIG. 1 is represented in FIG. 4 of the accompanying drawings by equipotential contours, two of which are indicated at 46. Each equipotential contour 46 describes a locus of constant electrical potential.

Close to the edge 48 of the negative internal electrode 40, the local strength of the electric field in the piezoelectric material is much higher than, for example, the average electric field in the region between the internal electrodes 36, 40. This increased local electric field, or electric field concentration, is indicated by the close spacing of the equipotential contours 46 close to the electrode edge 48 in FIG. 4. The piezoelectric material in the insulating region 44 responds piezoelectrically to this high strength electric field and, as a consequence, large mechanical stresses, or stress concentrations, are generated in the piezoelectric material. This situation occurs in the insulating regions at the edge of each internal electrode 36, 40, irrespective of its polarity.

The high electric field strength and concentration of stress in and close to the insulating regions 44 can cause short circuit failures. For example, the electric field strength may locally exceed the dielectric breakdown strength of the piezoelectric material, causing arcing between the internal electrodes 36, 40. Furthermore, the stress concentration can cause cracking of the layers 32 and the internal electrodes 36, 40, and can give rise to failure at the interfaces between the internal electrodes 36, 40 and the layers 32. The cracks act as regions of reduced dielectric strength, so that if cracks form between the internal electrodes 36, 40, the likelihood of arcing through the cracks is increased. When arcing occurs, the resulting temperature increase can cause melting or vaporisation of the material adjacent to the cracks. These and similar events at least reduce the ability of the actuator 30 to respond in the desired way to an applied voltage and, in many cases, the actuator completely fails.

Against this background, it would be desirable to provide a manufacturing method for manufacturing an actuator arrangement which reduces or overcomes the aforementioned difficulties.

According to a first aspect of the present invention, there is provided a method for manufacturing a piezoelectric actuator, the method comprising: co-extruding alternating strips of a high permittivity material and a low permittivity material to form a green tape comprising said alternating strips of said high permittivity material and said low permittivity material; cutting said green tape to form a plurality of sheets, each sheet comprising a high permittivity region and at least two low permittivity regions adjacent to the high permittivity region; applying at least one conductive region to each one of two or more of the sheets to overly the high permittivity region and to leave exposed at least one low permittivity region; and stacking a plurality of sheets to form an actuator stack comprising adjacent sheets, wherein the or each conductive region on each sheet is offset with respect to a conductive region on a different sheet within the actuator stack.

In a second aspect, the invention provides a method for manufacturing a piezoelectric actuator, the method comprising: forming a green tape comprising alternating strips of a high permittivity material and a low permittivity material by tape casting; cutting said green tape to form providing a plurality of sheets (158), each sheet comprising a high permittivity region and at least two low permittivity regions adjacent to the high permittivity region; applying at least one conductive region to each one of two or more of the sheets to overly the high permittivity region and to leave exposed at least one low permittivity region; and stacking a plurality of the sheets to form an actuator stack comprising adjacent sheets, wherein the or each conductive region on each sheet is offset with respect to a conductive region on a different sheet within the actuator stack.

In a third aspect, the invention provides a method for manufacturing a piezoelectric actuator, the method comprising: providing a plurality of sheets, each sheet comprising a high permittivity region and at least two low permittivity regions adjacent to the high permittivity region; detecting the position of a boundary between said high permittivity region and a low permittivity region of the sheet; applying at least one conductive region to each one of two or more of the sheets to overly the high permittivity region and to leave exposed at least one low permittivity region, an edge of said conductive region being aligned with said detected boundary; and stacking the sheets to form an actuator stack comprising adjacent sheets, wherein the or each conductive region on each sheet is offset with respect to a conductive region on a different sheet within the actuator stack.

By providing methods in which the actuator stack is formed by stacking layers comprising high permittivity piezoelectric regions and low permittivity insulating regions, an actuator can be formed in which thin, continuous internal electrodes formed from the conductive regions extend through an insulating coating of the stack, so as to minimise the electric field concentration, and hence the stress concentration, which arises when a voltage is applied to the actuator in use.

In an advantageous embodiment of the invention, each sheet comprises a plurality of high permittivity regions. The sheets comprise an alternating sequence of high permittivity regions and low permittivity regions, which are conveniently arranged as parallel strips of material.

The or each conductive region on each sheet is offset with respect to the or each conductive region on each adjacent sheet by a distance approximately equal to the width of one low permittivity region plus one high permittivity region. In this way, when the actuator stack is formed, the conductive regions are offset so as to form positive and negative internal electrodes of the actuator stack.

Suitably, the methods of the invention comprise cutting a green tape to form the sheets. The green tape comprises alternating strips of high permittivity material and low permittivity material. At least one of the sheets may comprise two or more layers of green tape. In this arrangement, pin-holes or other defects which may be present in the green tape do not extend through the thickness of a sheet, thus the undesirable effects of such defects, such as arcing and material breakdown, are reduced.

In an advantageous aspect of the invention, the green tape is formed by co-extrusion. Suitably, the green tape is formed by joining extruded strips of high permittivity material to extruded strips of low permittivity material.

In an alternative advantageous aspect of the invention, the green tape is formed by tape casting. For example, the green tape may be formed by a tape casting apparatus comprising dispensing means for dispensing alternating strips of low permittivity and high permittivity material.

The method may comprise applying the conductive region to the green tape before cutting the green tape into sheets. In this case, the conductive region may be applied to the green tape by a printing apparatus comprising printing means for applying the conductive region. The printing means may be aligned with the dispensing means of the tape casting apparatus, if provided.

The method may comprise applying the conductive region to the green tape after cutting the green tape into sheets. To ensure good alignment of the conductive region with the sheets, in any aspect of the invention the method may include detecting the position of a boundary between a high permittivity region and a low permittivity region of the sheet, and aligning an edge of the conductive region with the boundary. The position of the boundary may, for example, be detected by optical means. In alternative embodiments, the position of the boundary is detected by measuring a permittivity change at the boundary.

The conductive region or regions may be applied in a first pattern to a first group of sheets and in a second pattern to a second group of sheets. In this case, the sheets may be stacked in a repeating sequence comprising a sheet of the first group and a sheet of the second group. The or each conductive region on a sheet may be offset with respect to the or each nearest conductive region on a different sheet, for example an adjacent sheet. However, the or each conductive region on a sheet may instead be aligned with the or each nearest conductive region on a different sheet, for example an adjacent sheet, but be offset with respect to a conductive region on a sheet situated elsewhere in the stack.

The conductive regions may be applied to the sheets by printing. For example, the conductive region may be applied to the sheets by screen-printing, rolling, ink jet printing, or stamping.

In one embodiment of the invention, conductive regions are not applied to one or more sheets and the sheets are stacked in a sequence comprising a sheet of the first group, one or more sheets without conductive regions, and a sheet of the second group. Such a sequence may be, for example, a repeating sequence comprising a sheet of the first group, one or more sheets without conductive regions, a sheet of the second group, and one or more sheets without conductive regions. In this arrangement, pin-holes or other defects which may be present in the green tape once again do not extend through the thickness of a sheet, thus the undesirable effects of such defects are reduced.

The methods may comprise cutting the actuator stack from the stacked sheets. Conveniently, the methods comprise firing the actuator stack. The actuator stack may be cut from the stacked sheets before or after firing. Side electrodes may be applied to the actuator stack.

The invention also extends to a piezoelectric actuator manufactured by any of the methods previously described.

The methods of the present invention allow considerable flexibility in selecting a material for the insulating coating of the stack. One advantage of this flexibility is that, by selecting an appropriate material, the mechanical properties of the insulating coating can be optimised to meet the requirements of a particular application.

For example, during manufacture of the actuator, the polarisation of each of the piezoelectric layers is fixed in a process known as poling. Poling involves applying a voltage across the positive and negative side electrodes of the actuator while cooling the actuator from a relatively high temperature. The polarisation induced in the piezoelectric layers by the voltage applied during cooling is retained when the voltage is removed. Alternatively, poling may be performed by applying a voltage across the side electrodes at room temperature.

It is common for relatively wide cracks to form at or close to the faces of actuators during poling. The distance between these cracks is typically of the order of two to four millimetres. In use of the actuator, material such as water, fuel or solid debris may enter these cracks and cause the cracks to open further, leading to mechanical failure of the actuator. In addition, material entering the cracks may create conductive paths within the cracks, which may cause failure by short circuit or by dielectric breakdown.

The methods of the present invention allow the material of the insulating coating, in which such cracks tend to form, to be selected to mitigate or overcome the problems associated with cracking during poling. For example, in one approach, the material of the insulating coating is selected to have low resistance to cracking, such that a greater number of narrower cracks are formed than would otherwise be expected. Because the cracks are narrower, the ingress of debris and other material to the cracks is less likely, thus reducing the possibility of failure of the actuator. In another approach, the material of the insulating coating is selected to have high resistance to cracking, so that the likelihood of cracks forming during poling is significantly reduced, and the problem of material ingress into the cracks is avoided.

The material of the insulating coating may also be selected to have the same sintering behaviour as the material of the piezoelectric layers. For example, the sintering shrinkage rate of the material of the insulating coating, expressed as the rate of change of size of a body of material at a given firing temperature, may be matched to the sintering shrinkage rate of the material of the piezoelectric layers. In this way, distortion or fracture of the actuator stack during manufacture due to differential sintering shrinkage can be avoided.

Similarly, the coefficients of thermal expansion of the materials of the insulating coating and the piezoelectric layers may be matched, to prevent fracture of the actuator due to differential thermal expansion or contraction when the actuator heats up or cools down in use. Alternatively, the coefficient of thermal expansion of the material of the insulating coating may be lower than the coefficient of thermal expansion of the piezoelectric material of the layers. Such an arrangement is advantageous because, when the actuator cools from the firing temperature during manufacture, a compressive stress state arises in the insulating coating. This compression mitigates or reduces any tensile stress which arises during poling of the stack, to reduce the likelihood of cracking in the insulating coating.

Conveniently, the material of the insulating coating is similar to that of the piezoelectric layers, and differs only in composition. In an elegant arrangement, the high permittivity region comprises PZT of a first composition and the low permittivity region comprises PZT of a second composition. For example, the material of the insulating coating may be composed of PZT having a different ratio of lead zirconate to lead titanate to that of the piezoelectric material. In this way, the sintering behaviour and the physical properties, including the coefficients of thermal expansion, of the insulating coating and the piezoelectric layers can be matched while the desired electrical properties, particularly the piezoelectric coefficients and the dielectric constants, of the two materials differ. The high permittivity region may comprise PZT of a first density or porosity and the low permittivity region may comprise PZT of a second density or porosity, as an alternative or in addition to a difference in composition. Of course, the high permittivity region and the low permittivity region may be made from different materials and materials other than PZT as previously described.

In another aspect of the invention, there is provided a tape casting apparatus comprising dispensing means for dispensing alternating strips of a first material and a second material.

These and other aspects, objects and the benefits of this invention will become clear and apparent on studying the details of this invention and the appended claims.

All references cited herein are incorporated by reference in their entirety. Unless otherwise defined, all technical and scientific terms used herein have the same meaning as commonly understood by one of ordinary skill in the art to which this invention belongs.

Reference has already been made to FIGS. 1 to 4 of the accompanying drawings, in which.

Figure 5:
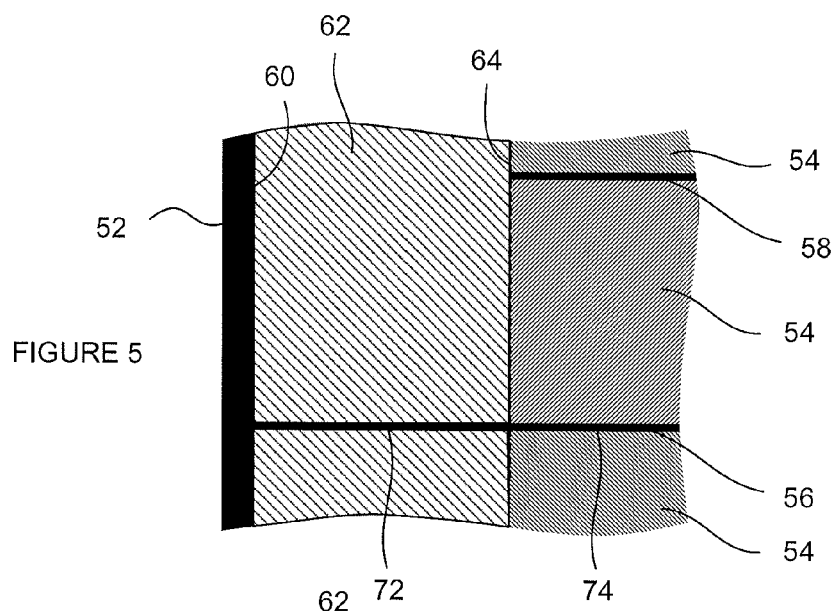
Figure 6:
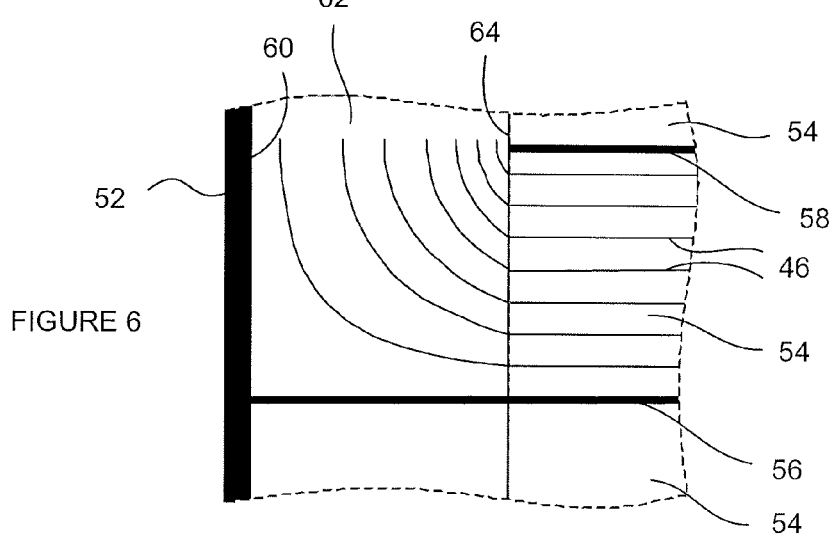
Figure 7:
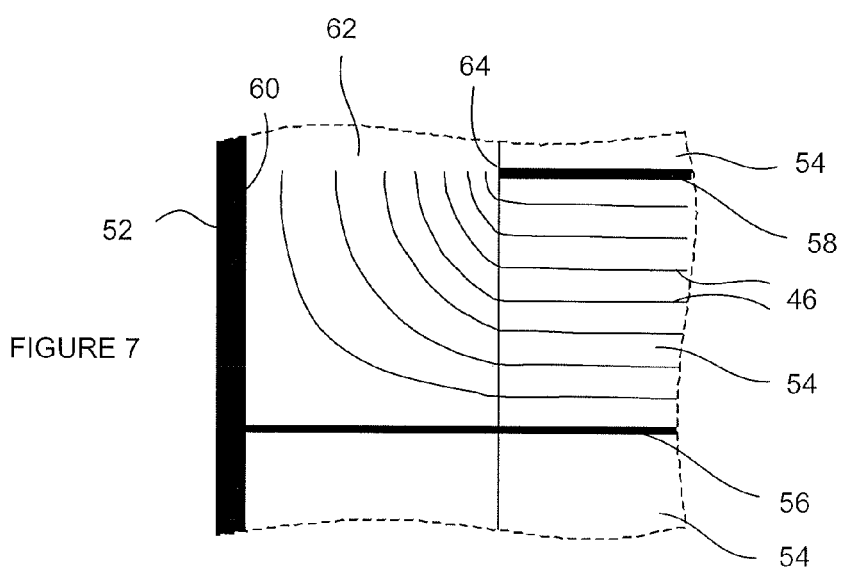
Figure 8:
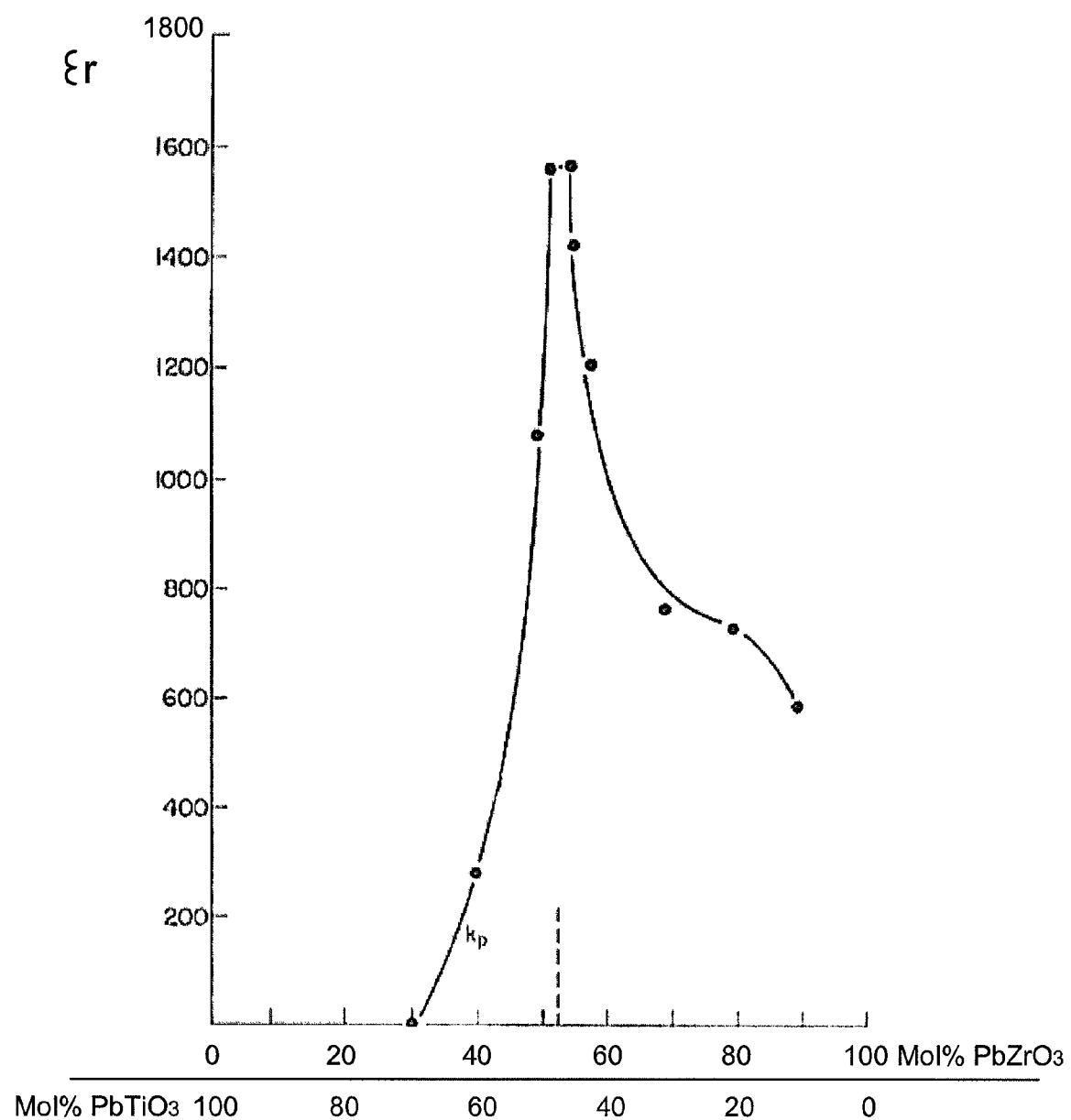
Figure 9:
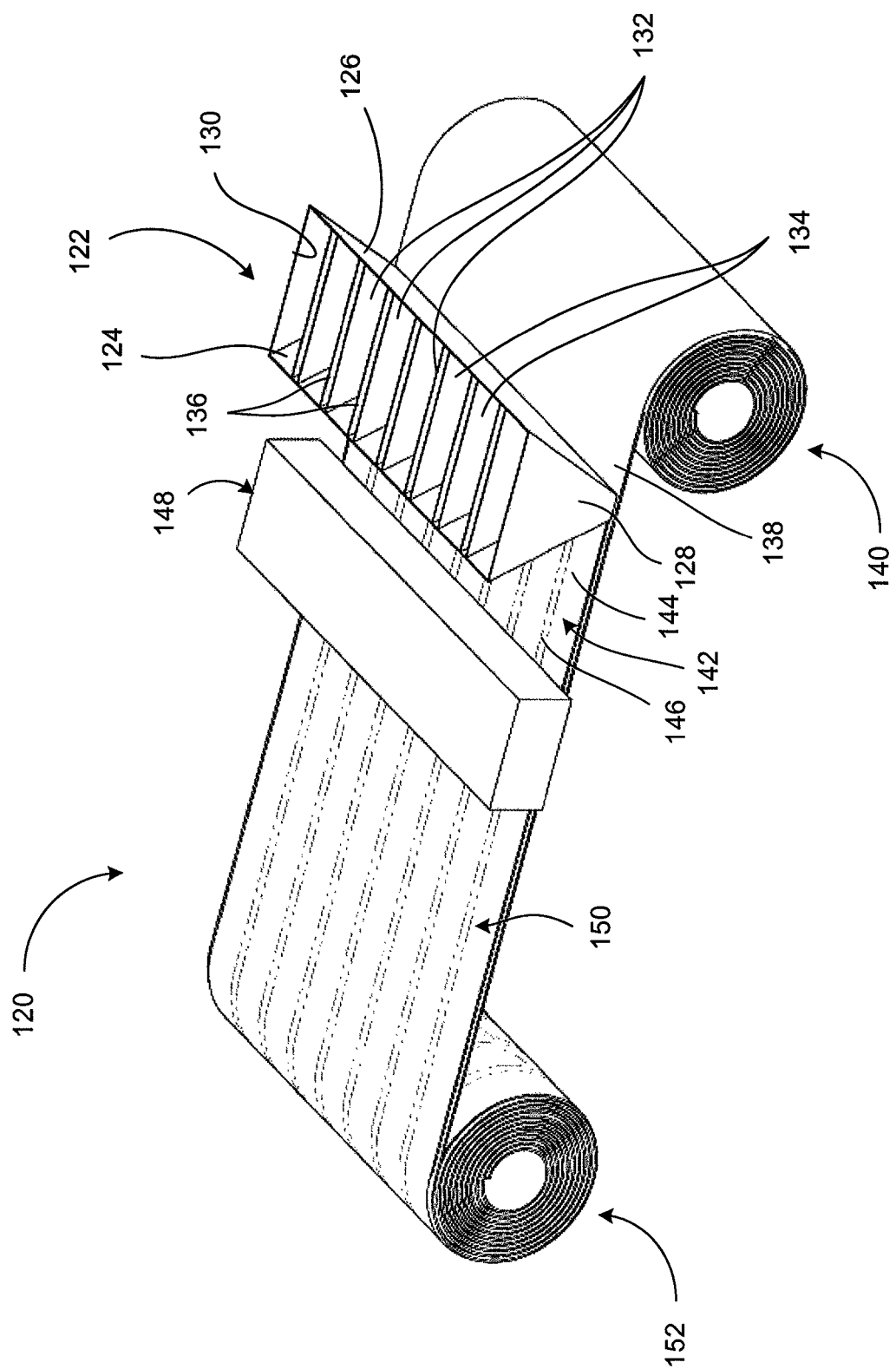
Figure 10:
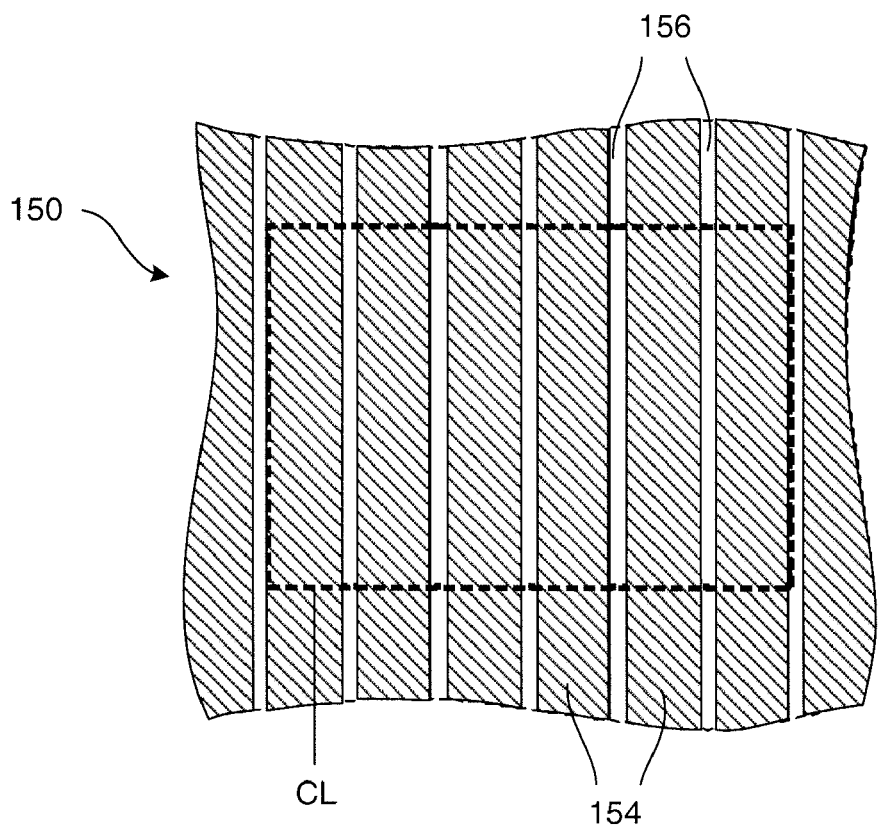
Figure 11:
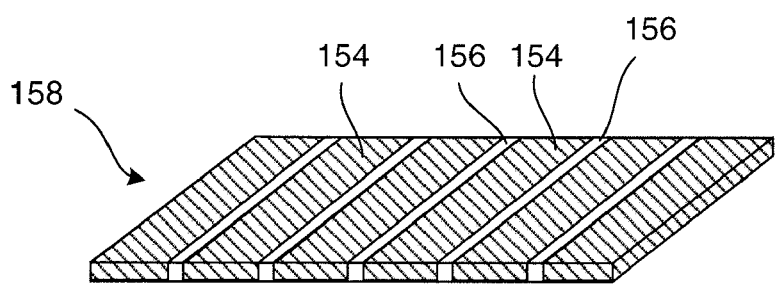
Figure 12:
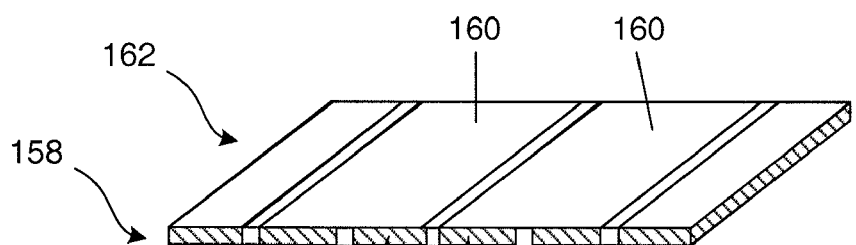
Figure 13:
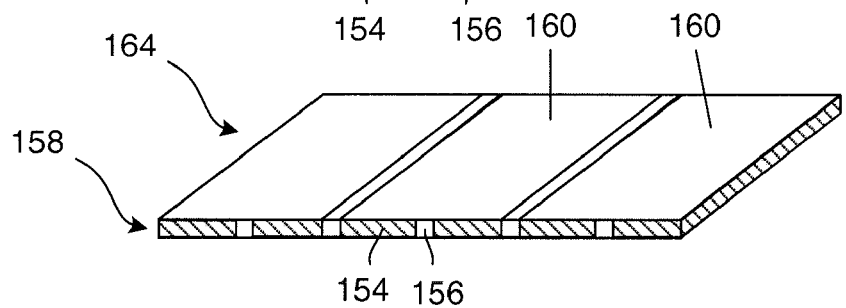
Figure 18:
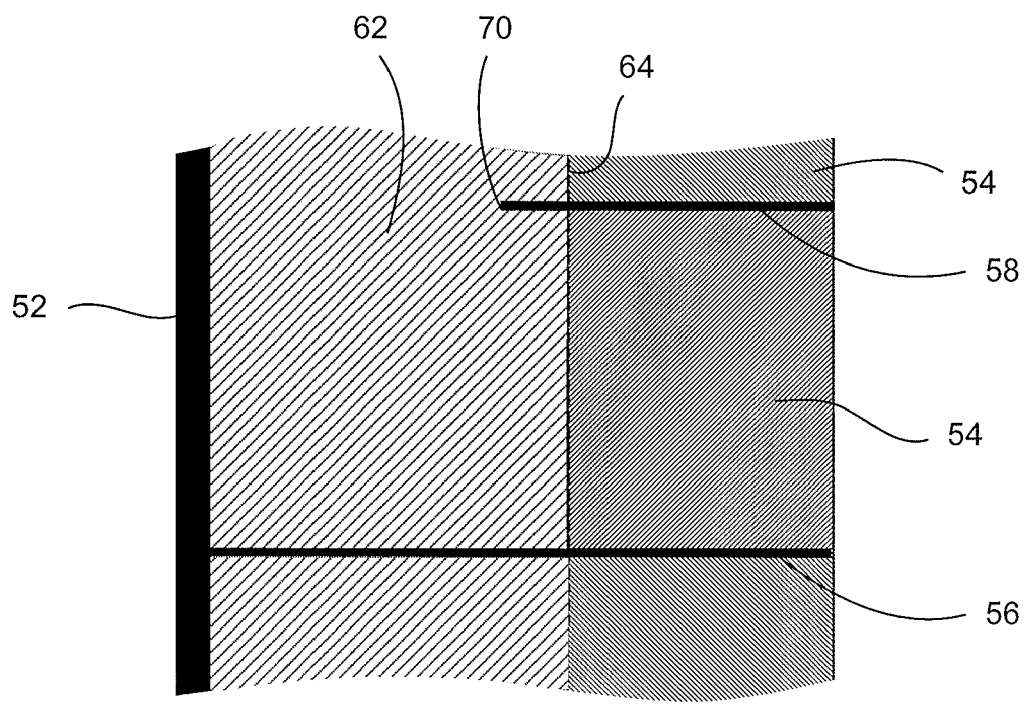
Figure 19:
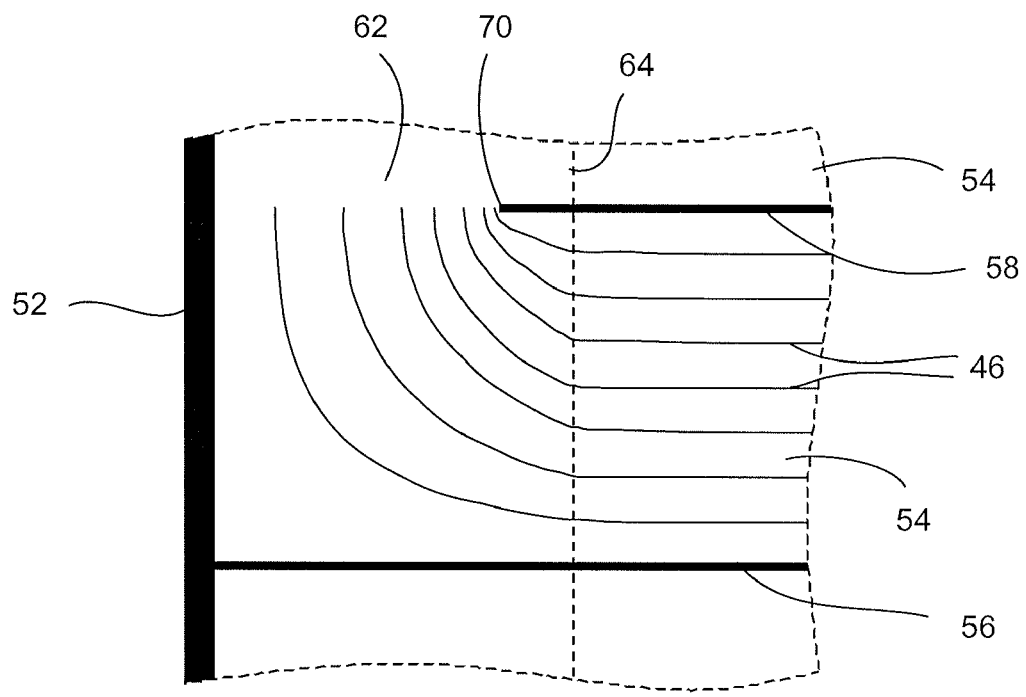
Figure 20:
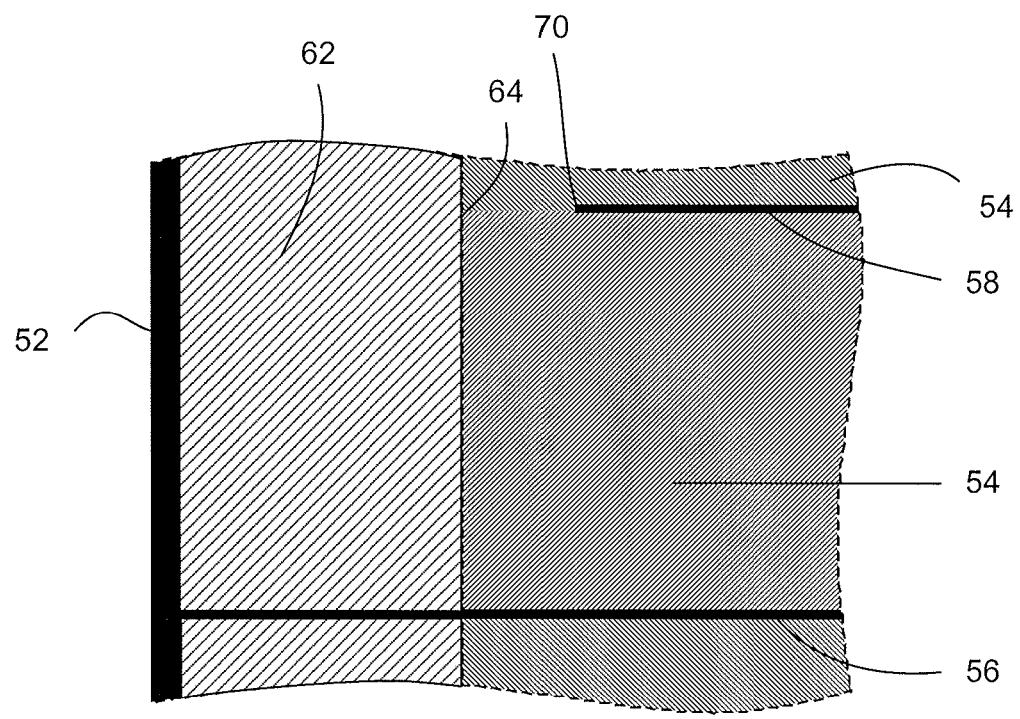
Figure 21:
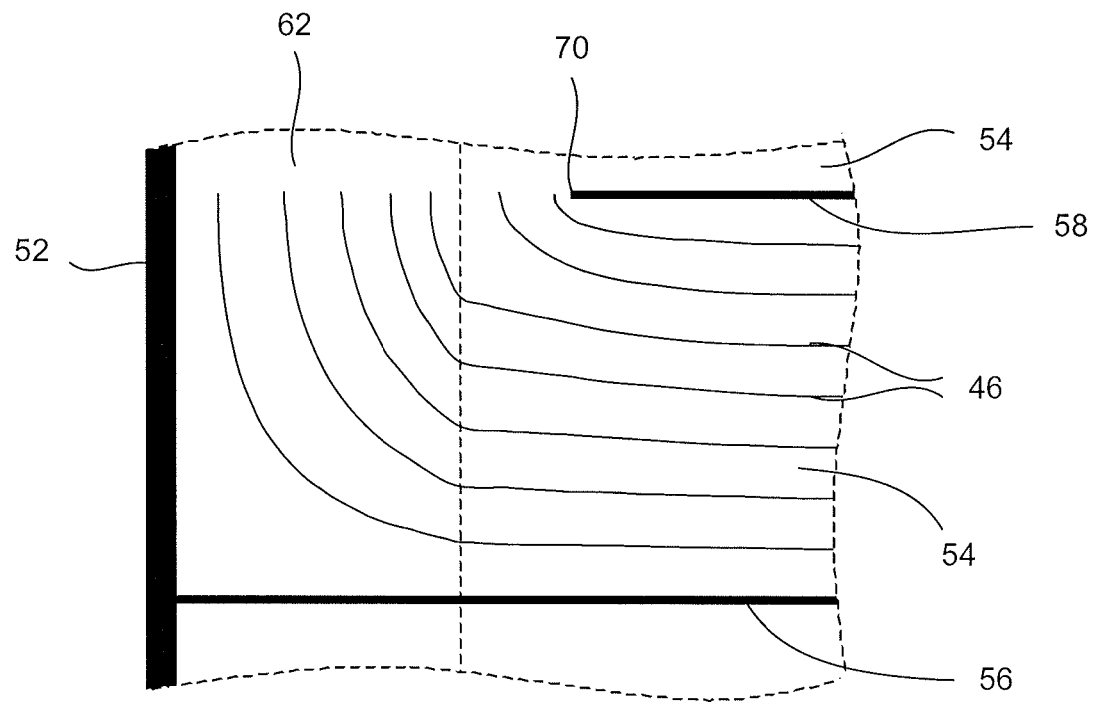
Figure 22:
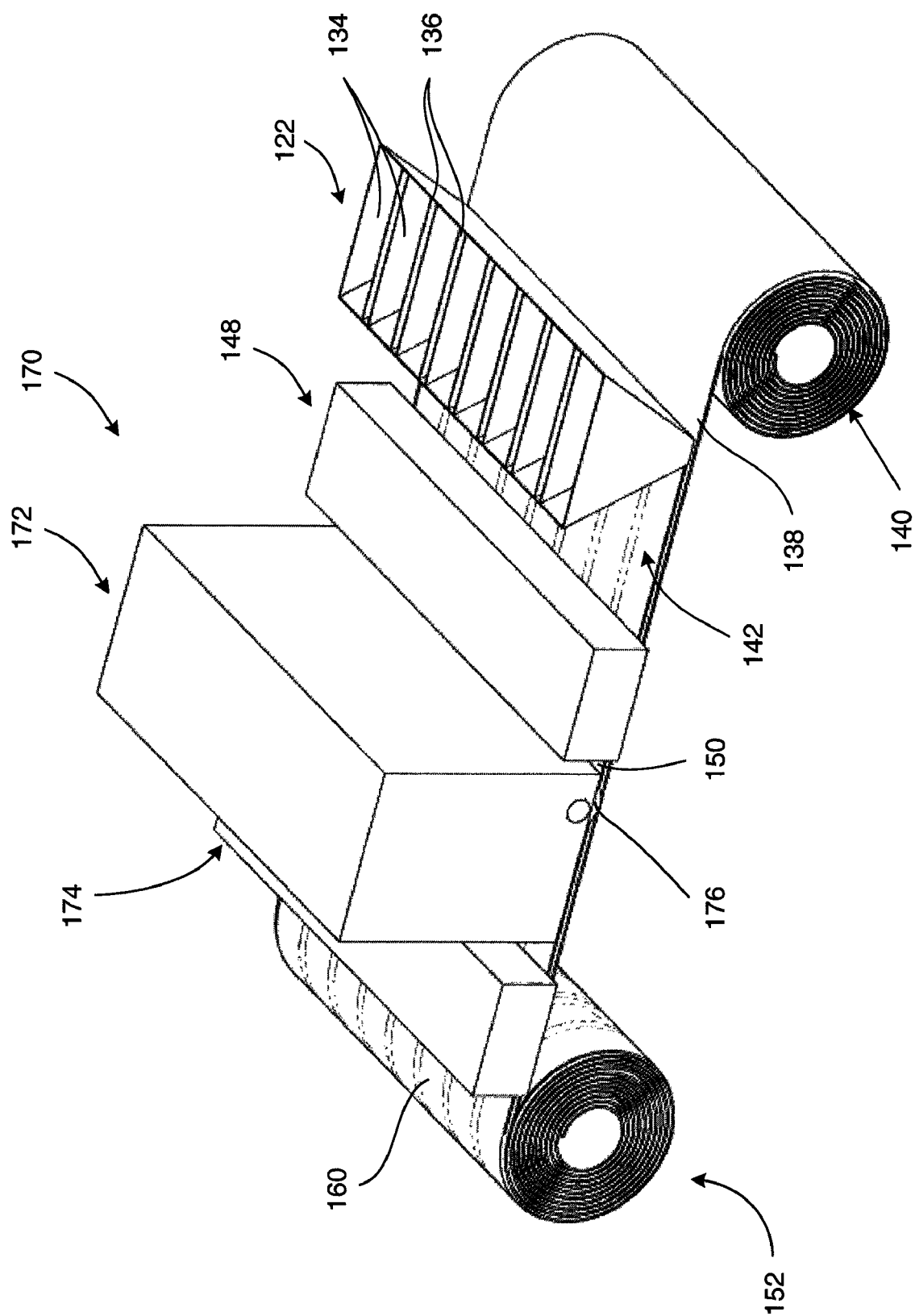

The invention will now be described, by way of example only, with reference to the remaining accompanying drawings, in which:

FIG. 5 is a sectional drawing of part of a first piezoelectric actuator suitable for manufacture by the method of the present invention;

FIG. 6 is a sectional drawing showing equipotential lines in part of the actuator of FIG. 5, in use;

FIG. 7 is a sectional drawing showing equipotential lines in part of a second piezoelectric actuator suitable for manufacture by the method of the present invention, in use;

FIG. 8 is a graph showing the variation of relative dielectric constant (Fr) with composition for lead zirconate titanate;

FIG. 9 is a perspective drawing of a first tape casting apparatus suitable for use in the method of the present invention;

FIG. 10 is a plan view of part of a green tape produced by the apparatus of FIG. 9;

FIG. 11 is a perspective view of a green sheet, cut from the green tape of FIG. 10;

FIG. 12 is a perspective view of the green sheet of FIG. 11, printed with conductive ink in a first pattern;

FIG. 13 is a perspective view of the green sheet of FIG. 11, printed with conductive ink in a second pattern;

FIG. 14 is an exploded perspective view of a plurality of green sheets in a stack, comprising the green sheets of FIG. 12 interleaved with the green sheets of FIG. 13;

FIG. 15 is a perspective view of the stack of FIG. 14 when assembled;

FIG. 16 is a perspective view of an actuator stack, cut from the stack of FIG. 15;

FIG. 17 is a perspective view of an actuator formed from the actuator stack of FIG. 16;

FIG. 18 is a sectional drawing of part of a third piezoelectric actuator suitable for manufacture by the method of the present invention;

FIG. 19 is a sectional drawing showing equipotential lines in part of the actuator of FIG. 18, in use;

FIG. 20 is a sectional drawing of part of a fourth piezoelectric actuator suitable for manufacture by the method of the present invention;

FIG. 21 is a sectional drawing showing equipotential lines in part of the actuator of FIG. 20, in use; and FIG. 22 is a perspective drawing of a second tape casting apparatus suitable for use in the method of the present invention.

FIG. 5 shows part of a piezoelectric actuator comprising an actuator stack 50, a positive side electrode 52 and a negative side electrode (not shown).

The actuator stack 50 comprises a plurality of piezoelectric layers 54 formed from a piezoelectric material, and a plurality of planar internal electrodes 56, 58, only two of which are shown in FIG. 5, disposed between the piezoelectric layers 54. The internal electrodes 56, 58 are alternately in electrical connection with the positive side electrode 52 and the negative side electrode.

The internal electrodes in electrical connection with the positive side electrode 52 are referred to as the positive internal electrodes 56. Likewise, the internal electrodes in electrical connection with the negative side electrode are referred to as the negative internal electrodes 58. The stack 50 therefore comprises a repeating sequence of positive internal electrode 56; piezoelectric layer 54; negative internal electrode 58; and piezoelectric layer 54.

The periphery of the stack 50 defines a cuboid, having two square end faces (not shown) parallel to the planes of the internal electrodes 56, 58, and four rectangular side faces containing directions parallel to the long axis of the stack 50. One of the rectangular side faces of the stack 50 (the positive face 60) carries the positive side electrode 52 and the opposed rectangular side face of the stack 50 (the negative face, not shown) carries the negative side electrode.

The insulating means comprises a coating 62 of insulating material disposed between the piezoelectric layers 54 and the periphery of the stack 50. The coating 62 therefore defines a piezoelectric/insulator interface 64 parallel to the long axis of the stack 50 between the insulating coating 62 and the piezoelectric layers 54. The insulating coating is present at the positive face 50 and at the negative face of the stack, but is not present at the remaining rectangular side faces of the stack 50. The insulating material has a negligible or low piezoelectric response, and a permittivity which is approximately 0.1% of the permittivity of the piezoelectric material of the layers.

The positive internal electrodes 56 extend through the insulating coating 62 at the positive face 60 of the stack 50 and emerge from the stack 50 at the positive face 60, while the negative internal electrodes 58 do not extend into the insulating coating 62 at the positive face 60 of the stack 50. Similarly, the negative internal electrodes 58 extend through the insulating coating at the negative face of the stack and emerge at the outside surface of the negative face, while the positive internal electrodes 56 do not extend into the insulating coating at the negative face of the stack. The internal electrode which extends across the insulating coating 62 indicated in FIG. 5 is a positive internal electrode 56.

The positive side electrode 52 comprises a conductive material which is carried on the insulating coating 62 at the positive face 60 of the stack. The conductive material of the positive side electrode 52 is therefore in electrical contact with the positive internal electrodes 56 emergent at the positive face 60 of the stack.

Likewise, the negative side electrode comprises a conductive material which is carried on the insulating coating at the negative face 60 of the stack. The conductive material of the negative side electrode is in electrical contact with the negative internal electrodes 58 emergent at the negative face of the stack.

It can be seen in FIG. 5 that an interface between the conductive material of the positive internal electrode 56 and the insulating material of the insulating coating 62 defines a first surface 72. An internal boundary of the piezoelectric layer 54, adjacent to the internal electrode 56, defines a second surface 74. These first and second surfaces 72, 74 are substantially continuous with one another in the vicinity of the piezoelectric/insulator interface 64, because the internal electrodes 56 have a uniform thickness across the interface 64. In addition, the first and second surfaces 72, 74 lie perpendicular to the plane of the piezoelectric/insulator interface 64.

Figure 1:
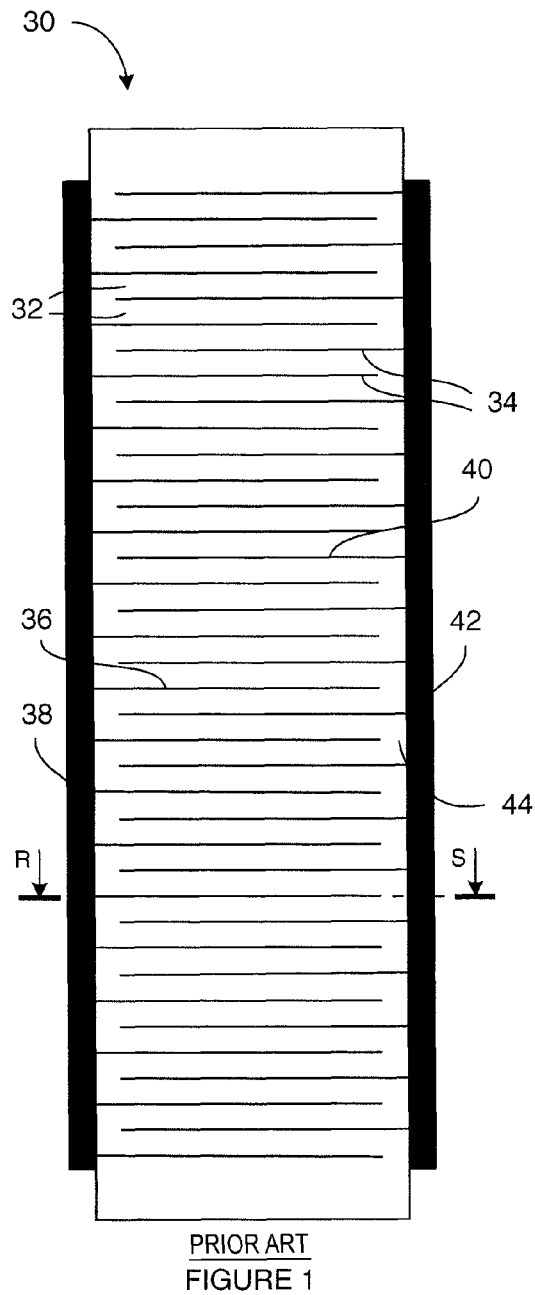
FIG. 1 is a sectional drawing of a known piezoelectric actuator.
Figure 2:
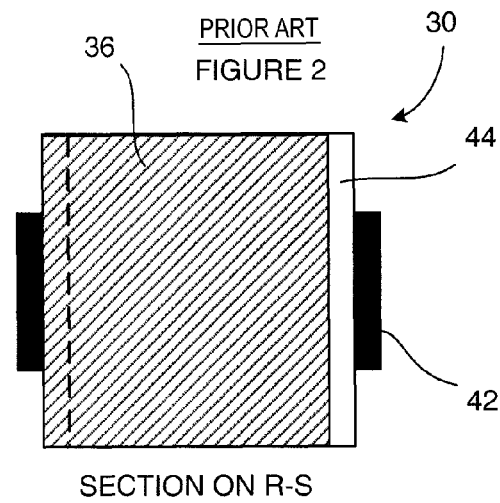
FIG. 2 is a cross-section on R-S of the actuator of FIG. 1.

In use, a voltage is applied across the positive and negative side electrodes of the actuator. As shown in FIG. 6, as a consequence of the applied voltage, an electric field arises in the piezoelectric layers 54 and in the insulating coating 62, in which equipotential lines (two of which are indicated at 46) indicate the strength and direction of the electric field. In this actuator construction, the change in permittivity at the piezoelectric/insulator interface 64 causes the electric field in the piezoelectric material to dominate over the electric field in the insulating coating 62. Therefore, there is no significant concentration of the electric field in the piezoelectric layers 54 close to the periphery of the stack. In addition, the concentration of electric field in the insulating coating 62 is reduced in comparison to the electric field concentration that occurs at the edges of the internal electrodes in the conventional actuator shown in FIGS. 1, 2 and 4. Consequently, there is no significant concentration of stress in the piezoelectric material, and there is less chance of dielectric breakdown due to the lower local electric field strengths. The actuator of FIGS. 5 and 6 therefore offers much improved reliability over existing actuators.

FIG. 7 shows equipotential lines 46 in a piezoelectric actuator identical in construction to that shown in FIGS. 5 and 6, but in which the insulating coating 62 has a permittivity which is approximately 25% of the permittivity of the material of the piezoelectric layers 54. The Applicant has discovered that, even though the permittivity of the insulating coating 62 is substantially greater than in the actuator shown in FIGS. 5 and 6, the change in permittivity at the piezoelectric/insulator interface 64 is still sufficient to cause the electric field in the piezoelectric layers 54 to dominate over the electric field in the insulating coating 62. Thus a relatively small change in permittivity at the piezoelectric/insulator interface 64 is sufficient to avoid any significant concentration of the electric field in the piezoelectric layers 54 close to the periphery of the stack, and to reduce the concentration of electric field near the edges of the internal electrodes 56, 58 in comparison to the conventional actuator shown in FIGS. 1, 2 and 4.

As will now be explained, both the piezoelectric layers 54 and the insulating coating 62 of the actuator of FIG. 7 can be made from a ferroelectric material such as lead zirconate titanate (PZT). As is typical of ferroelectric materials, the permittivity of PZT, expressed as the relative dielectric constant, varies substantially with the composition of the material, particularly when the composition is close to the composition at which a ferroelectric phase transition occurs. For example, FIG. 8 shows the variation at room temperature of the relative dielectric constant $\in_r$ of PZT with the composition of the material. PZT is a mixture of lead zirconate ($PbZrO_3$) and lead titanate ($PbTiO_3$). A rhombohedral to tetragonal ferroelectric phase transition occurs when the composition is approximately 53 mol % $PbZrO_3$. At this composition, known hereafter as the ferroelectric phase transformation composition, the relative dielectric constant peaks at a value in excess of 1600.

A substantially lower dielectric constant than this peak value can be realised in PZT by making a small change to the composition of the material. For example, increasing the content of $PbTiO_3$ by about 10% to give a composition with approximately 43 mol % $PbZrO_3$ results in a dielectric constant of approximately 400, which is around 25% of the peak value.

The actuator of FIG. 7 employs PZT both for the high permittivity piezoelectric layers 54 and for the low permittivity insulating coating 62. The piezoelectric layers 54 are made from PZT having a composition of approximately the ferroelectric phase transformation composition (53 mol % $PbZrO_3$, hereafter known as high permittivity PZT), while the insulating coating 62 is made from a PZT having a composition of 43 mol % $PbZrO_3$, hereafter known as low permittivity PZT.

The piezoelectric response of PZT also varies with the composition of the material. Like the relative dielectric constant, the piezoelectric response, expressed by one or more piezoelectric coefficients, peaks when the composition of the material is approximately equal to the ferroelectric phase transition composition and is lower at PZT compositions lying away from the ferroelectric phase transition composition. Thus, while the insulating coating 62 made from low dielectric constant PZT has some piezoelectric response, the response is significantly lower than that of the material of the piezoelectric layers 54, and the corresponding piezoelectric stresses which arise adjacent to the ends of the internal electrodes 56, 58 in the insulating coating 62 of the actuator of FIG. 7 are substantially reduced in comparison to those which arise close to the ends of the internal electrodes in the actuator of FIG. 1.

A manufacturing method suitable for making the actuator shown in FIG. 7 will now be described.

FIG. 9 shows schematically a tape casting apparatus 120 suitable for use in the manufacturing method. The tape casting apparatus 120 includes a reservoir 122. The reservoir 122 is hopper-shaped, having two sides 124, 126 inclined towards one another to define a tapering shape. The inclined sides 124, 126 do not meet at the base of the reservoir 122, but instead define a gap or outlet (not shown) through which the contents of the reservoir 122 may exit the reservoir 122 at its base. The sides or ends of the reservoir 122 are closed by trapezoidal end plates 128, 130, each end plate 128, 130 having a long edge parallel to a short edge. The long edges of each end plate 128, 130 extend between respective top corners of the inclined sides 124, 126 of the reservoir 122. The short edges of each end plate 128, 130 extend between respective bottom corners of the inclined sides 124, 126 of the reservoir 122, so as to define ends of the outlet.

The reservoir 122 is divided into sections or tanks by a plurality of dividers or baffles 132. Each baffle 132 has a similar shape to the end plates 128, 130 of the reservoir 122 and forms a liquid-tight seal or joint with the inclined sides 124, 126 of the reservoir 122. The baffles 132 are arranged parallel to the end plates 128, 130 so as to form an alternating sequence of wide tanks 134 and narrow tanks 136 within the reservoir 122.

As is known in the art, the tape casting apparatus 120 is arranged to draw a substrate 138 horizontally under the reservoir 122 and beneath a doctor blade (not shown) situated adjacent to the outlet of the reservoir 122.

In use, a substrate 138 comprising a thin polyester film is provided on a feed roll 140 within the apparatus 120, and the tanks 134, 136 are charged with PZT slurry comprising PZT particles dispersed in a solvent and a polymeric binder. The wide tanks 134 are charged with PZT slurry containing high permittivity PZT particles, and the narrow tanks 136 are charged with slurry containing low permittivity PZT particles.

As the substrate 138 is drawn under the reservoir 122, slurry flows out of each of the tanks 134, 136, through the outlet of the reservoir 122 and deposits on the substrate. The substrate 138 and the deposited slurry then pass under the doctor blade, which is positioned at a pre-defined distance above the substrate 138 and lies in a direction which is transverse to the direction of movement of the substrate 138, and hereafter referred to as the transverse direction. As the deposited slurry is drawn underneath the doctor blade, the blade levels the slurry to form a layer 142 of pre-defined, uniform thickness as previously described with reference to FIG. 4.

By virtue of the horizontal movement of the substrate 138 and the arrangement of the tanks 134, 136 within the reservoir 122, the PZT slurries are deposited in alternating strips upon the substrate 138. The high dielectric constant PZT slurry is deposited in wide strips 144 from the wide tanks 134, and these wide strips 144 are interlineated with narrow strips 146 of low dielectric constant PZT slurry deposited from the narrow tanks 136. Each strip 144, 146 runs parallel to the direction of movement of the substrate 138. Upon deposition, some mixing of the slurries occurs which serves to ensure that the strips 144, 146 of low dielectric constant and high dielectric constant materials together form a layer 142 on the substrate which is substantially homogeneous with regard to structure and density, whilst being non-homogeneous with regard to composition and electrical properties.

Figure 4:
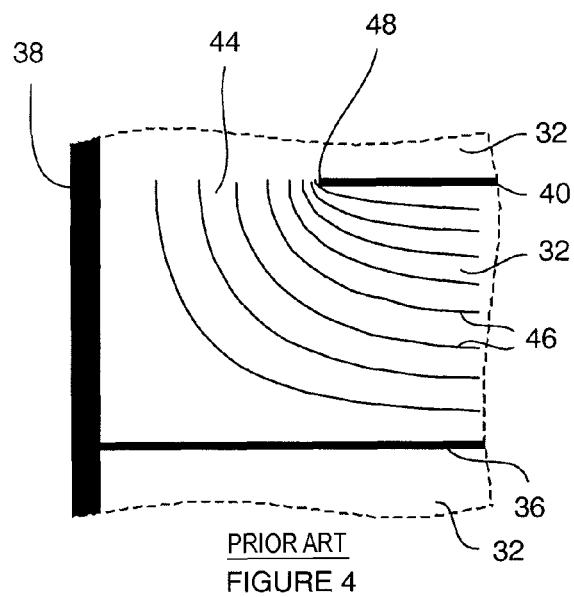
FIG. 4 is a sectional drawing showing equipotential lines in part of the actuator of FIGS. 1 and 2, in use.
Figure 3:
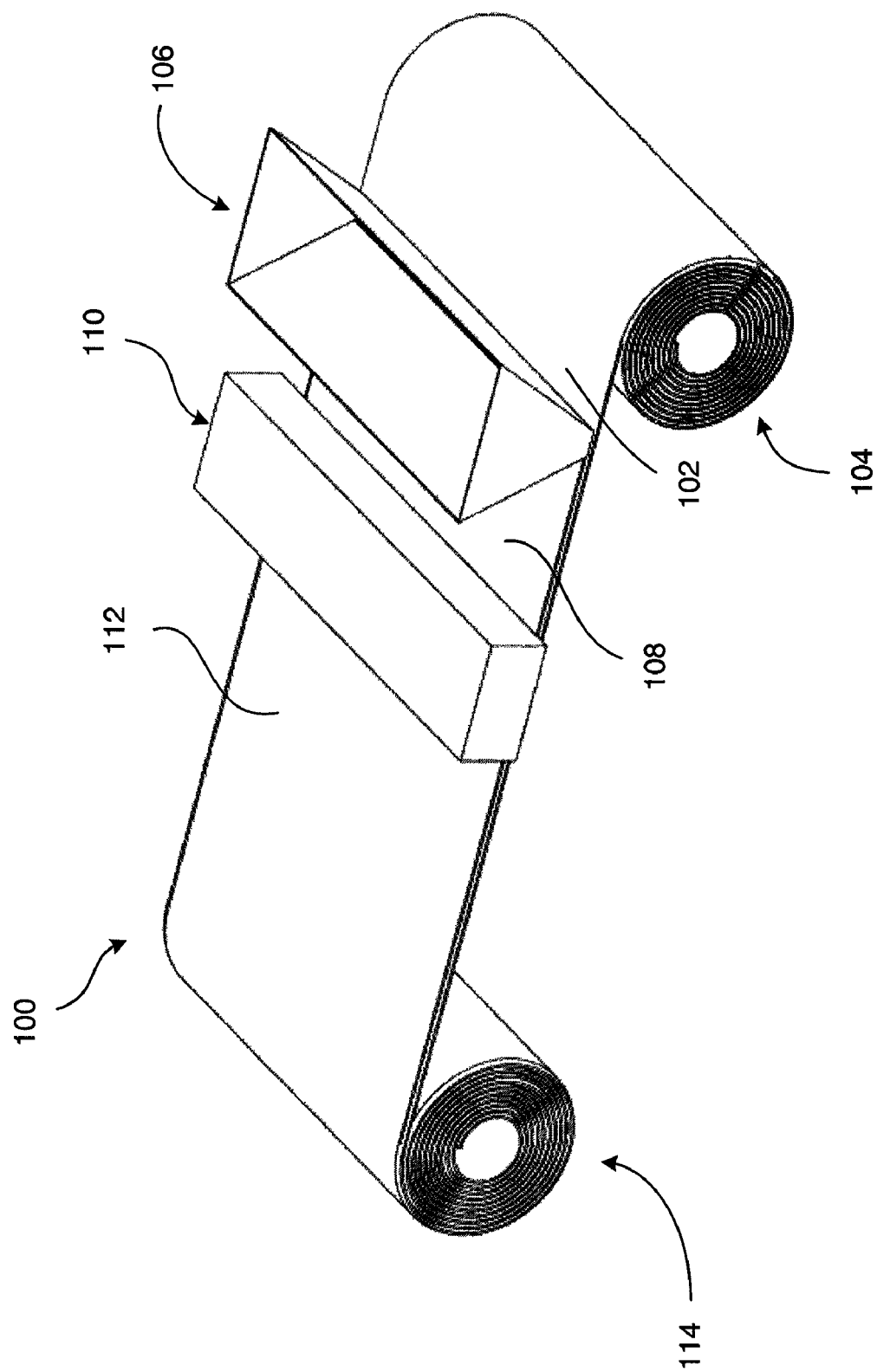
FIG. 3 is a perspective drawing of a tape casting apparatus suitable for use in the manufacture of the actuator of FIGS. 1 and 2.

The substrate 138 and the slurry layer 142 then pass into a drying assembly 148 similar to that described with reference to FIG. 4, which gently heats the slurry so as to evaporate the solvent. After drying, the resulting green tape 150 retains the composite structure of the deposited layer 142 and comprises alternating strips of high dielectric constant PZT material and low dielectric constant PZT material.

After leaving the drying assembly 148, the substrate 138 and the composite green tape 150 are wound on to a receiving roll 152. FIG. 10 is a schematic representation of the green tape 150 produced by the apparatus of FIG. 9, showing alternating wide strips 154 of high dielectric constant PZT and narrow strips 156 of low dielectric constant PZT.

To manufacture an actuator from the green tape 150 of FIG. 10, the green tape 150 is first removed from the substrate 138. Then, green sheets 158 (one of which is illustrated in FIG. 11) of predetermined size are cut or punched from the green tape 150 along the cut lines CL in FIG. 10. Each green sheet 158 has an area several times that of the cross-sectional area of an individual actuator. For example, the green sheet 158 may have an area of the order of 100 to 1000 times the cross-sectional area of an individual actuator. Cutting of the green tape 150 is performed using a suitable cutting apparatus, typically comprising a heated platen on which the green tape 150 is placed, and one or more heated blades which are pressed in to the tape where a cut is to be made. The heat softens the polymeric binder of the tape 150, so as to allow a clean cut to be made without tearing or otherwise damaging the tape 150.

FIG. 11 is a schematic representation of a green sheet 158, obtained by cutting the green tape 150 along the cut lines CL indicated in FIG. 10. Although the green sheet 158 of FIG. 11 has only six strips 154 of high dielectric constant PZT across its transverse direction, in practice a green sheet 158 may have substantially more strips 154, 156 across its transverse direction than shown in FIG. 11.

After cutting, the green sheets 158 are transferred to means for printing internal electrodes onto the surface of the sheets 158. In this first embodiment of the method, the printing means is a screen printer (not shown), which includes a screen comprising metal wires or polymeric threads arranged over a frame in a fine mesh. The screen is patterned so that ink can only pass through the screen where printing on the green sheet 158 is desired. The screen is held close to the green sheet 158, and a squeegee is drawn across the screen to force the ink through the holes within the mesh of the screen and on to the surface of the green sheet 158. The ink is a conductive ink which comprises metal particles, such as platinum particles, dispersed in a solvent.

In this way, internal electrodes (56, 58 in FIG. 7) can be formed on the surface of the green sheets 158 in any desired pattern. To make the actuator of FIG. 7, a number of green sheets 158 are printed as shown in FIG. 12 so that every second narrow strip 156 of low dielectric constant PZT remains uncovered by ink, while all of the wide strips 154 of high dielectric constant PZT are covered by ink. Therefore, at least away from the edges of the sheet 158, the printed regions 160 cover one narrow strip 156 of low dielectric constant PZT and two wide strips 154 of high dielectric constant PZT adjacent to the narrow strip 156.

A number of sheets 158 are printed with ink in a first pattern 162 as shown in FIG. 12, and a further number of sheets 158 are printed with ink in a second pattern 164 as shown in FIG. 13. The second pattern 164 of ink is offset with respect to the first pattern 162 in the transverse direction by an amount equal to the total width of one narrow strip 156 and one wide strip 154 of PZT. Therefore, the narrow strips 156 of the sheets 158 which are printed with ink in the first pattern 162 are not covered with ink in the sheets 158 printed with ink in the second pattern 164, and vice versa. In other words, when counting from the edge of the sheet, the first, third and fifth narrow strips 156 of the sheet 158 printed with ink in the first pattern 162, shown in FIG. 12, are not covered with ink, while the second and fourth narrow strips 156 of the sheet 158 printed with ink in the second pattern 164, shown in FIG. 13, are not covered with ink. After printing, the sheets 158 are transferred to an ink drying means (not shown), which is similar to the drying assembly of the tape casting apparatus. The solvent of the conductive ink evaporates under the influence of heat supplied by the ink drying means.

The printed green sheets 158 are then laid on top of one another, so as to form a green stack 166 as shown in FIG. 14 in exploded view and in FIG. 15. The number of green sheets 158 in the green stack 166 corresponds to the number of layers required in the piezoelectric actuator, which is typically around 1000 layers. For clarity, only five sheets 158 are shown in FIGS. 14 and 15. As shown most clearly in FIG. 14, sheets 158 printed with ink in the first and second patterns 162, 164 are arranged alternately within the stack 166, so that sheets 158 printed with the first pattern 162 are interleaved with sheets 158 printed with the second pattern 164. In this way, the printed regions 160 of ink are staggered throughout the green stack 166.

The stacked sheets 158 are pressed together, as shown in FIG. 15. Heat is applied to the stack 166 during pressing so that the polymeric binder softens, which causes the sheets 158 to bind or fuse to one another. The green stack 166 is then heated to a firing temperature of around 1000° C. in order to cause the binder to burn away and to densify the stack 166.

The sintered stack, which is similar in appearance to the green stack 166 of FIG. 15, is then diced or cut into individual actuator stacks 168, one of which is shown in FIG. 16. Cutting may be performed by, for example, laser cutting or conventional machining. The actuator stack 168 of FIG. 16 is cut from a sintered stack along the cutting lines DL indicated in FIG. 15. The sintered stack is cut so that each narrow strip 156 of low dielectric constant PZT is bisected across its width, so that the width of each actuator stack 168 is equal to the width of one wide strip 154 plus one narrow strip 156, after any sintering shrinkage has taken place.

As shown in FIG. 16, the wide strip 154 of high dielectric constant PZT of each sheet 158 forms piezoelectric layers 54 of the actuator stack 168, the printed regions 160 of conductive ink form positive internal electrodes 56 and negative internal electrodes 58, and the bisected narrow strips 156 of low dielectric constant PZT form the insulating coating 62 on two rectangular outside faces of the actuator stack 168.

The faces of the actuator stack 168 may be polished or otherwise machined in order to expose the positive internal electrodes 56 on the positive face 60 of the stack 168 and the negative internal electrodes 58 on the negative face 66 of the stack 168, and to remove defects from the surface of the stack 168 thereby improving the resistance of the actuator to cracking, in use.

As shown in FIG. 17, a positive side electrode 52 is applied to the positive face 60 of the stack 168 which contains the emergent ends of the positive internal electrodes 56. Likewise, a negative side electrode 68 is applied to the negative face 66 of the stack 168 which contains the emergent ends of the negative internal electrodes 58. The side electrodes 52, 68 may be applied, for example, by printing, gluing or soldering a conductive strip on or to the appropriate faces 60, 66 of the stack 168.

In this way, an actuator of the type shown in FIG. 7 is produced.

It will be appreciated that the method described above with reference to FIGS. 9 to 17 can also be applied, with appropriate modification, to produce the actuator of FIGS. 5 and 6, in which the insulating coating 62 is not made from low dielectric constant PZT but is instead made from an insulating ceramic material, such as alumina.

In this case, the narrow tanks 136 of the reservoir 122 are charged with a alumina slurry, comprising zirconia particles dispersed in a solvent, along with a polymeric binder. The green tapes 150 produced by the apparatus shown in FIG. 9 thus comprise wide strips 154 of high dielectric constant PZT separated from one another by narrow strips 156 of alumina.

The method is carried out as previously described to manufacture the actuator shown in FIGS. 5 and 6.

It will be appreciated that the narrow tanks 136 of the tape casting apparatus 120 can be charged with any appropriate material to manufacture actuators having insulating coating 62 comprising any desired substance. For example, instead of PZT or alumina, any other suitable ceramic material could be used, for example zirconia or silica. Likewise, the wide tanks 134 of the reservoir 122 can be charged with any appropriate slurry to manufacture actuators having piezoelectric layers 54 made from any desired material.

It is also possible to produce an actuator in which the insulating coating 62 is made from PZT with low permittivity, such as that shown in FIG. 7, by substituting the low dielectric constant PZT slurry described previously for an alternative PZT slurry in which the PZT particles have a composition identical to those used in the high dielectric constant PZT slurry. In one such alternative slurry, the volume fraction of polymeric binder is increased in comparison to the volume fraction of binder in the high dielectric constant PZT slurry. During firing of the stack 166, in this case the increased quantity of binder burns away to leave an increased volume fraction of pore space between the particles. When the particles sinter together, not all of this pore space is eliminated, so that the final, fired material in the insulating coating 62 is more porous, and is consequently less dense and has a lower dielectric constant, than the material made from the high dielectric constant PZT slurry in the piezoelectric layers 54 of the stack.

In another alternative PZT slurry, particles of inert, burnable material such as starch grains are included within the slurry. During firing, these particles burn away to leave pores, which again serve to decrease the density and hence the piezoelectric constant of the material in the insulating coating 62.

During manufacture of an actuator according to the method described above, satisfactory alignment between the components of the actuator must be obtained. In particular, the regions 160 of conductive ink used to form the internal electrodes 56, 58 must be printed in the correct position relative to the wide and narrow strips 154, 156 of the green sheets 158.

Ideally, one edge of each printed region 160 should lie directly on top of the boundary between a narrow strip 156 and a wide strip 154 of the green sheet 158. In other words, the resulting internal electrode 56, 58 should terminate at an edge which lies at the piezoelectric/insulator interface 64 (i.e. the boundary between the insulating coating 62 and the piezoelectric layer 54), as shown in FIG. 5. The Applicant has discovered, however, that some degree of misalignment is possible without adversely affecting the reduction of field concentration, and hence the reduction of stresses, in the insulating coating 62 and piezoelectric layers 54 of the stack 168.

FIG. 18 shows a cross-section through part of an actuator similar to that of FIG. 5, but having a negative internal electrode 58 misaligned with respect to the piezoelectric/insulator interface 64. The edge 70 of the negative internal electrode 58 lies within the insulating coating 62, beyond the interface 64. FIG. 19 shows equipotential contours 46 which indicate the strength of the electric field which arises in the piezoelectric layers 32 and in the insulating coating 62 when a voltage is applied between the positive side electrode 52 and the negative side electrode (not shown in FIGS. 18 and 19). While the electric field is more concentrated in the actuator of FIGS. 18 and 19 when compared to the actuator with ideal alignment shown in, for example, FIGS. 5 and 6, the concentration of electric field is still much reduced compared to the conventional actuator of FIGS. 1, 2 and 4. Furthermore, because the electric field concentration in FIG. 19 is primarily found in the non-piezoelectric material of the insulating coating, stress concentrations due to the piezoelectric effect do not arise, or are at least reduced.

Likewise, FIG. 20 shows a cross-section through part of an actuator similar to that of FIG. 18, but in which the edge 70 of the misaligned negative internal electrode 58 lies between the piezoelectric layers 54, short of the piezoelectric/insulator interface 64. Once again, as shown in FIG. 21, the electric field is more concentrated in the actuator of FIGS. 20 and 21 when compared to the properly aligned actuator shown in, for example, FIGS. 5 and 6, but the concentration of electric field is still much reduced compared to the conventional actuator of FIGS. 1, 2 and 4.

Sufficient alignment of the internal electrodes 56, 58 may be achieved by accurate registration of the green sheets 158 within the screen-printing apparatus when printing the regions 160 of conductive ink. For example, optical or mechanical registration means may be used to ensure that the green sheet 158 is positioned accurately within the screen-printing apparatus, as is known in the art.

Alternative methods for ensuring sufficient alignment of the internal electrodes 56, 58 lie within the scope of the invention, as will now be described.

One such method for ensuring alignment comprises identifying the locations of the boundaries between the insulating material in the narrow strips 156 and the piezoelectric material in the wide strips 154 of each green sheet 158, and using the identified locations to align the printing apparatus with those boundaries. The boundaries may be identified by optical means, in which case variations in the optical properties of the materials are detected by suitable optical sensors. For example, the insulating and piezoelectric materials may have different opacity. Such a difference can be conveniently detected in transmitted light, wherein a light source is provided on a first side of the green sheet 158 and a light intensity sensor, for example a photoresistor, photocapacitor or charge-coupled device, is provided on a second side of the green sheet 156 to detect variations in the intensity of transmitted light which correspond to the boundaries between the materials of the sheet. In a further example, one or both of the insulating or piezoelectric materials are coloured, for example by adding a colouring agent to the slurry, so that the insulating and piezoelectric materials are differently coloured. In this case, the boundaries between the strips 154, 156 can be detected optically, for example by known image analysis techniques.

The difference in permittivity between adjacent strips 154, 156 of material in the green sheets 158 can also be exploited to allow identification of the boundaries between the strips 154, 156. For example, probes may be applied on each side of a green sheet 158, and an a.c. or d.c. electric field, driven by a suitable driver circuit, is passed through the sheet 158 between the probes. The probes are then moved across the green sheet 158. By monitoring the current-voltage response of the driver circuit, the changes in permittivity which occur at the boundaries between the wide and narrow strips 154, 156 can be detected, and hence the location of the boundaries can be determined.

In a further variation of the method, sufficient alignment between the internal electrodes 56, 58 and the piezoelectric/insulator interfaces 64 is obtained by incorporating a means for printing the internal electrodes within the tape casting apparatus. FIG. 22 shows a tape casting apparatus 170 similar to the apparatus of FIG. 9, except in that a printing assembly 172 for printing the conductive ink onto the green sheet 150 is provided between a first drying assembly 148 and the receiving roll 152, and in that a second drying assembly 174 is provided between the printing assembly 172 and the receiving roll 152.

The manufacture of an actuator using the apparatus of FIG. 22 will now be described. As previously described with reference to FIG. 9, a substrate 138 passes from a feed roll 140 beneath a reservoir 122 which is divided into tanks 134, 136 and underneath a doctor blade (not shown) so as to cast a layer 142 comprising alternating strips of piezoelectric and insulating material onto the substrate 138.

After passing through the first drying assembly 148, which is identical to the drying assembly of the apparatus of FIG. 9, the substrate 138 and the green tape 150 pass beneath the printing apparatus 172. The printing apparatus comprises rollers 176 which are arranged to contact the surface of the green tape 150, an ink reservoir (not shown), and ink delivery means (not shown) arranged to deliver ink from the reservoir to the rollers 176. The ink reservoir is charged with conductive ink.

By virtue of the longitudinal movement of the green tape 150 beneath the rollers 176, strips or regions 160 of ink are printed onto the green tape 150 as the tape 150 and the substrate 138 pass beneath the printing apparatus 172. The rollers 176 are positioned so that the ink is deposited in a desired pattern, similar to the patterns 162, 164 shown in FIGS. 12 and 13. Because the printing apparatus 172, and therefore the position of the rollers 176, is fixed with respect to the reservoir 122 of the tape casting apparatus 170, satisfactory alignment of the printed regions 160 with the boundaries between materials in the green tape 150 is obtained.

After emerging from the printing apparatus 172, the green tape 150 passes into the second drying assembly 174. The second drying assembly 174 comprises a suitable heating arrangement to dry the printed ink. For example, the second drying assembly 174 may be similar to the first drying assembly 148. The substrate 138 and green tape 150, carrying the printed regions 160, are then wound onto the receiving roll 152.

The green tape 150 is then removed from the substrate 138 and cut or punched into green sheets 158, as previously described with reference to FIGS. 10 to 13. However, in this case, the resulting green sheets 158 are already printed with ink to form the internal electrodes of the actuator and no further printing is necessary. Thus, after cutting, the green sheets 158 are similar to those shown in FIGS. 12 and 13. Sheets may be printed in the first pattern 162 (as shown in FIG. 12) and in the second pattern 164 (as shown in FIG. 13) by, for example, offsetting the relative positions of the cuts made in the green tape 150 to form the sheets 158. Alternatively, first and second green tapes may be produced, the first green tape having a pattern of printed electrodes offset from that of the second green tape to form the first and second patterns 162, 164. The first and second green tapes may then be cut as described with reference to FIGS. 10 and 11.

Green sheets 158 printed with the first and second patterns 162, 164 are then stacked, pressed and fired to form a dense actuator stack 168, and side electrodes 52, 68 are then applied to the actuator stack 168 to form a completed actuator as previously described with reference to FIGS. 14 to 17.

It will be appreciated that many variations of the manufacturing method are possible, and that there is considerable scope for variation of the apparatus used in the method. Some such variations and options will now be described, by way of example only.

In any embodiment of the invention, some green sheets 158 which do not have conductive regions 160 may be provided and stacked alternately with the green sheets 158 which carry conductive regions 160 as previously described. For example, the stack of sheets may define a repeating sequence of sheets comprising a green sheet 158 printed with the first pattern 162, an unprinted green sheet 158, a green sheet 158 printed with the second pattern 164, and an unprinted green sheet 158. Upon sintering, the unprinted green sheets fuses with the adjacent printed green sheets of the stack, such that the piezoelectric layers 54 of the sintered stack have a thickness twice that of a sintered single sheet. In this way, pin-holes or other defects which may be present in the green sheets 158 prior to stacking are unlikely to extend through the whole thickness of a piezoelectric layer 54 in the actuator.

It will be appreciated that two or more unprinted sheets could be included between each printed sheet of the stack. Furthermore, the unprinted sheets may be bonded to printed sheets or to other unprinted sheets in an initial process before the complete stack of sheets is assembled. For example, an unprinted sheet may be bonded to each printed sheet by rolling or pressing at elevated temperature before the bonded sheets are themselves stacked.

When unprinted sheets are included in the stack, the distribution of unprinted sheets need not be regular throughout the stack. In this way, the thickness of the piezoelectric layers of the actuator may vary throughout the stack. For example, the piezoelectric layers at or close to the ends of the stack may be thicker than those in the central portion of the stack away from the ends. Such an arrangement may reduce stresses at the ends of the stack when the actuator is in use.

Any suitable tape casting apparatus may by used in the method of the invention, and the design of the appropriate apparatus will be influenced by the materials used, the width and thickness of the desired green tape, the required throughput of the apparatus, and so on. In particular, the size of the reservoir of the tape casting apparatus, and its location with respect to the substrate, the speed of movement of the substrate and the position of the doctor blade can be selected to give the desired thickness and quality of the tape cast sheet.

The or each drying assembly of the tape casting apparatus may comprise any suitable means for heating the slurry in order to drive off the solvent in the slurry or in the ink. For example, the or each drying assembly may comprise, alone or in combination, infra-red lamps, microwave generators, warm air generators, heated surfaces upon which the substrate is carried, or liquid-filled heating elements.

In the methods described above, the substrate is removed from the green tape before cutting of the tape into green sheets. However, the substrate may be left in place during the cutting operation, and possibly also during the printing of conductive ink to form the internal electrodes. The substrate need only be removed at some point before the sheets are stacked together.

The tanks of the reservoir may be recharged with slurry once the amount of slurry remaining in a tank reaches a pre-determined level, or the tanks may be constantly recharged by a suitable means for feeding slurry to the reservoir. Indeed, if a feeding means is employed, the reservoir may be eliminated and the feeding means may deposit slurry directly onto the substrate. Instead of a reservoir divided into tanks by baffles, a reservoir comprising a plurality of individual tanks could be provided. In this arrangement, each tank has its own side walls which are not shared by another tank. Conveniently, each tank may be independently removable for replacement or maintenance.

Various means for printing conductive ink onto the green tape or green sheets could be employed. For example, screen-printing or rolling as previously described, or ink-jet printing, stamping, or any other suitable process can be used to print conductive ink on to either the green tape before cutting, or on to the green sheets after cutting.

When any of these printing means is employed, the manufacturing process may be modified to increase the accuracy of the alignment of the edge of the printed regions with the boundary between the insulating coating and the piezoelectric layer. For example, conductive ink could first be printed in an oversized pattern, so that the conductive ink covers a larger area than desired. The layer of conductive ink could then be trimmed back, for example using a laser trimming apparatus, so that the edge of the conductive ink overlies the boundary. Such a trimming operation could be performed at any point after printing of the ink and before stacking of the sheets. Alternatively, the conductive ink may include a photocurable component, so that an oversized pattern of ink can be further shaped or trimmed in a photolithographic process to achieve the desired alignment.

After stacking of the green sheets, the order in which the firing and dicing processes take place may be varied. As described above, the stack of sheets may be fired before the dense body is cut into individual actuator stacks. Alternatively, the stack of green sheets may first be cut into green actuator stacks, which can the be fired individually. In either case, during the firing process the stacks may be loaded in uniaxial, biaxial or hydrostatic compression to aid the sintering process.

While the method of the invention has been described with reference to tape casting, alternative ceramic processing methods may be employed to produce composite green sheets comprising adjacent regions of low permittivity material and regions of high permittivity, piezoelectric material. For example, a co-extrusion process can be used, in which stiff slurries of the low and high permittivity materials are forced through suitably shaped dies under pressure. In this case, two narrow dies can be arranged on either side of a wide, central die. By supplying the wide die with high permittivity slurry and the narrow dies with low permittivity slurry, the extrusion formed is a composite ribbon of unfired ceramic comprising a central high permittivity region with low permittivity regions at the margins. The two materials fuse to one another upon leaving the dies. The ribbon can then be sliced into individual actuator layers, which is then printed with internal electrodes, stacked and fired as previously described.

In another example, a conventional tape casting or extrusion process may be used to produce green tapes or ribbons made from a single material. These single-material green tapes or ribbons are cut into appropriate widths and lengths, and placed into the desired arrangement for the composite green sheet. The tapes or ribbons are then joined to one another, for example by hot rolling, or by moistening the material prior to rolling.

Although particular embodiments of the invention have been disclosed herein in detail, this has been done by way of example and for the purposes of illustration only. The aforementioned embodiments are not intended to be limiting with respect to the scope of the appended claims, which follow. It is proposed by the inventors that various substitutions, alterations, and modifications may be made to the invention without departing from the spirit and scope of the invention as defined by the claims.

The invention claimed is:

1. A method for manufacturing a piezoelectric actuator, the method comprising:
   providing a green tape comprising alternating strips of a high permittivity material and a low permittivity material;

cutting said green tape to form a plurality of sheets, each sheet comprising a high permittivity region and at least two low permittivity regions adjacent to the high permittivity region;

applying at least one conductive region to each one of two or more of the sheets to overlay the high permittivity region and to leave exposed at least one low permittivity region; and stacking a plurality of the sheets to form an actuator stack comprising adjacent sheets, wherein each conductive region on each sheet is offset with respect to a conductive region on a different sheet within the actuator stack.

2. The method of claim 1, wherein each sheet comprises a plurality of high permittivity regions.

3. The method of claim 1, wherein the high permittivity regions and low permittivity regions comprise parallel strips of material.

4. The method of claim 1, wherein each conductive region on each sheet is offset with respect to the or each conductive region on each adjacent sheet by a distance approximately equal to the width of one low permittivity region plus one high permittivity region.

5. The method of claim 1, wherein at least one of the sheets comprises two or more layers of green tape.

6. The method of claim 1, wherein the position of a boundary between a high permittivity region and a low permittivity region of the sheet is detected, and an edge of the conductive region is aligned with said detected-boundary.

7. The method of claim 6, wherein the position of the boundary is detected by optical means.

8. The method of claim 6, wherein the position of the boundary is detected by measuring a permittivity change at the boundary.

9. The method of claim 1, wherein said conductive regions are applied in a first pattern to a first group of sheets and in a second pattern to a second group of sheets.

10. The method of claim 9, wherein the sheets are stacked in a repeating sequence comprising a sheet of said first group and a sheet of said second group.

11. The method of claim 9, wherein said conductive regions are not applied to one or more sheets and the sheets are stacked in a repeating sequence comprising a sheet of the first group, one or more sheets without conductive regions, and a sheet of the second group.

12. The method of claim 1, further comprising cutting said actuator stack from the stacked sheets.

13. The method of claim 1, further comprising firing the actuator stack.

14. The method of claim 1, further comprising applying side electrodes to the actuator stack.

15. The method of claim 1, wherein the high permittivity region comprises lead zirconate titanate of a first composition and the low permittivity region comprises lead zirconate titanate of a second composition.

16. The method of claim 1, wherein said green tape is formed by one of:

joining extruded strips of said high permittivity material to extruded strips of said low permittivity material; and dispensing said high permittivity material and said low permittivity material from a reservoir of a tape casting apparatus.

* * * * *